(12) United States Patent
Cheng et al.

(10) Patent No.: US 10,939,584 B1
(45) Date of Patent: Mar. 2, 2021

(54) HEAT DISSIPATION MODULE AND ASSEMBLY METHOD THEREOF

(71) Applicant: Getac Technology Corporation, Hsinchu County (TW)

(72) Inventors: Hung-Chan Cheng, Taipei (TW); Wei-Chung Hsiao, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/547,783

(22) Filed: Aug. 22, 2019

(51) Int. Cl.
*H05K 7/20* (2006.01)
*H05K 1/18* (2006.01)
*H05K 1/02* (2006.01)

(52) U.S. Cl.
CPC ......... *H05K 7/2039* (2013.01); *H05K 1/0203* (2013.01); *H05K 1/181* (2013.01); *H05K 2201/066* (2013.01); *H05K 2201/10159* (2013.01); *H05K 2201/10522* (2013.01)

(58) Field of Classification Search
CPC ...... G06F 1/20; H05K 1/0203; H05K 1/0204; H05K 1/181; H05K 7/2039; H05K 2201/066; H05K 2201/10159; H05K 2201/10522
See application file for complete search history.

(56) References Cited

U.S. PATENT DOCUMENTS

| 5,089,936 A | * | 2/1992 | Kojima | H01L 23/4006 257/697 |
| 2005/0088092 A1 | * | 4/2005 | Kim | H05K 7/20963 313/582 |
| 2006/0181858 A1 | * | 8/2006 | Kamemoto | H01L 23/433 361/719 |
| 2015/0261266 A1 | * | 9/2015 | Dean | H05K 7/20518 361/679.46 |
| 2015/0301568 A1 | * | 10/2015 | Hill | H05K 7/20481 361/714 |
| 2017/0125326 A1 | * | 5/2017 | Schneider | H01L 23/49548 |
| 2019/0246488 A1 | * | 8/2019 | Kuklinski | H01L 23/4006 |

\* cited by examiner

*Primary Examiner* — Jacob R Crum
(74) *Attorney, Agent, or Firm* — Locke Lord LLP; Tim Tingkang Xia, Esq.

(57) ABSTRACT

The present invention relates to a heat dissipation module and an assembly method thereof. The heat dissipation module includes a heat conductive plate and a buffer member. The heat conductive plate includes a cover section and a first extension section. The cover section covers a heat zone. The buffer member is provided at the heat conductive plate to interferingly match with a housing, so as to conduct heat energy produced by the heat zone to the housing. Accordingly, by configuring the buffer member between the heat conductive plate and the housing, the heat conductive plate is allowed to be reliably thermally adhered to the housing, thereby achieving enhanced heat dissipation efficiency for the heat dissipation module.

13 Claims, 11 Drawing Sheets

HEAT DISSIPATION MODULE AND ASSEMBLY METHOD THEREOF

BACKGROUND OF THE INVENTION

Field of the Invention

The present invention relates to a heat dissipation structure installed in the interior of an electronic device, and more particularly to a heat dissipation module and an assembly method thereof.

Description of the Prior Art

Heat dissipation conventionally used for a solid-state drive (SSD) usually achieves a uniform temperature by enveloping an exterior by a metal foil, and the metal foil is adhered to a housing to have heat energy produced by the SSD to be conducted to the housing through the metal foil. However, if the metal foil is not reliably thermally adhered to the housing and heat energy is thus not conducted to the exterior, the heat energy becomes accumulated at the metal foil, resulting in a limited cooling effect.

In view of the above, with respect to the prior art above, it is a development goal of the Applicant to solve the above issues with the aid of extensive search and the exercise of theories.

SUMMARY OF THE INVENTION

The present invention provides a heat dissipation module and an assembly method thereof, in which a buffer member is configured between a heat conductive plate and a housing, allowing the heat conductive plate to be reliably thermally adhered to the housing and thereby achieving enhanced heat dissipation efficiency for the heat dissipation module.

According to an embodiment of the present invention, the present invention provides a heat dissipation module, including: a heat conductive plate, including a cover section and a first extension section, the cover section covering a heat zone; and a buffer member, provided at the heat conductive plate to interferingly match with a housing, so as to conduct heat energy produced by the heat zone to the housing.

According to an embodiment of the present invention, the present invention provides a heat dissipation module, including: a sub-circuit board, having a first installation surface and a second installation surface opposite to each other; and a heat conductive plate, including a cover section and a first extension section, the cover section covering the first installation surface, the first extension section covering the second installation surface.

According to an embodiment of the present invention, the present invention provides an assembly method for a heat dissipation module, the method including steps of: a) preparing a heat conductive plate and a first back adhesive, sequentially dividing the heat conductive plate into a cover section, a first link section, a first extension section, a second link section and a second extension section, placing in advance the first back adhesive on an inner side of the heat conductive plate and across the cover section, the first link section and the first extension section; and b) preparing a buffer member and a second back adhesive opposite to each other, the buffer member having an adhering surface and an abutting surface, and placing in advance the second back adhesive at the adhering surface.

In conclusion of the above, when the sub-circuit board is fixed in the interior of a housing of an electronic device, the buffer member is clamped between the sub-circuit board and the housing and becomes pressed and deformed. The deformed buffer member produces an elastic restoring force, so as to provide a forward force for pushing the heat conductive plate towards the housing, and the heat conductive plate is allowed to be reliably thermally adhered to the housing through the buffer member, thereby increasing a contact area for thermal conduction and achieving enhanced heat dissipation effect for the heat dissipation module.

DETAILED DESCRIPTION OF THE EMBODIMENTS

Details and technical contents of the present invention are given with the accompanying drawings below. However, it should be noted that the accompanying drawings are for illustration purposes and are not to be construed as limitations to the present invention.

Referring to FIG. 1 to FIG. 11, the present invention provides a heat dissipation module and an assembly method thereof, wherein the heat dissipation module includes heat conductive plate 1 and a buffer member 2.

Figure 1:
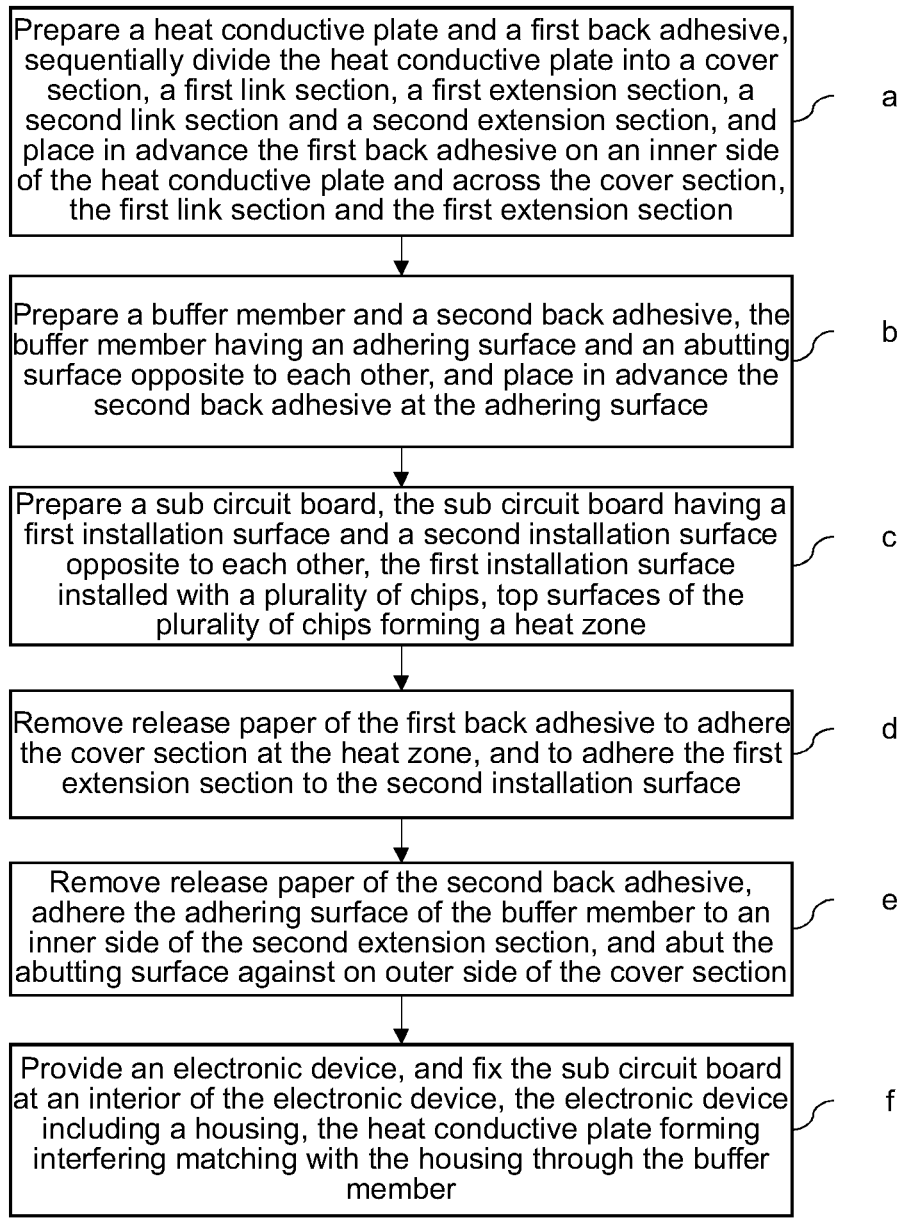
FIG. 1 is a flowchart of steps of an assembly method for a heat dissipation module of the present invention.
Figure 2:
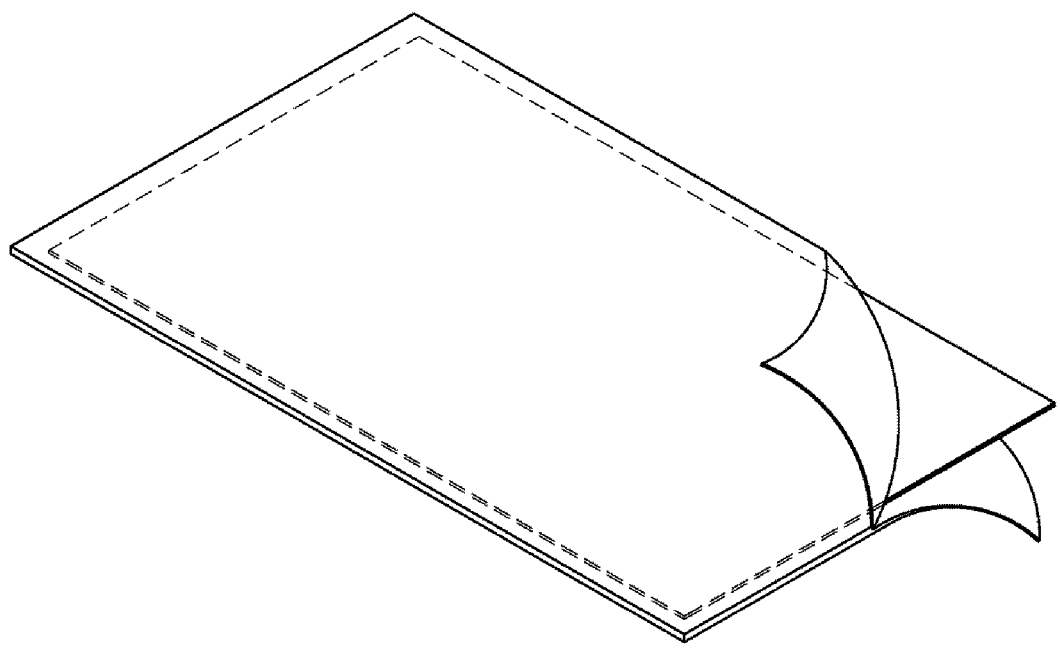
FIG. 2 is a perspective schematic diagram of a heat conductive plate of the present invention.
Figure 3:
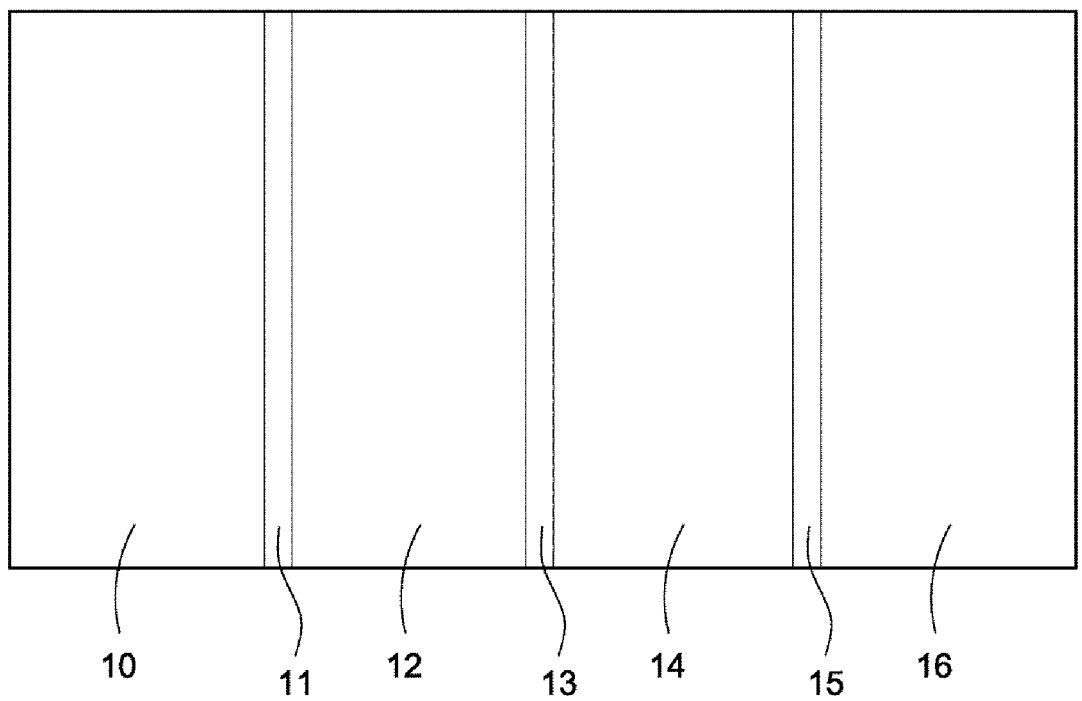
FIG. 3 is a top schematic diagram of a heat conductive plate of the present invention.
Figure 4:
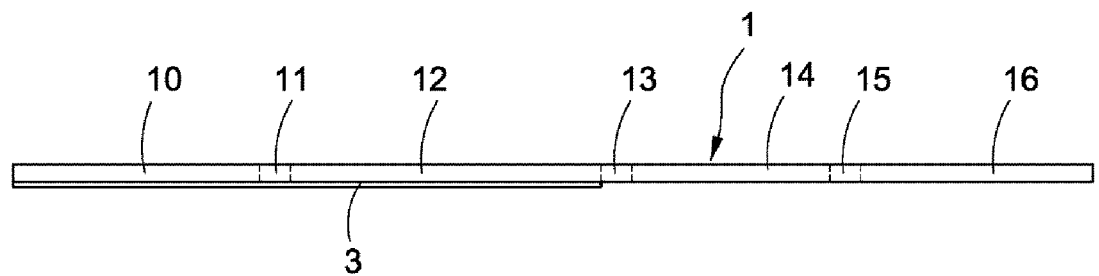
FIG. 4 is a section schematic diagram of a first back adhesive having been placed in advance on an inner side of a heat conductive plate.

FIG. 1 shows a flowchart of steps of an assembly method for a heat dissipation module of the present invention. First of all, as shown by step a in FIG. 1 and FIG. 2 to FIG. 4, a heat conductive plate 1 and a first back adhesive 3 are prepared. The heat conductive plate 1 is formed by a metal sheet enveloped by a plastic film, and is sequentially divided into a cover section 10, a first link section 11, a first extension section 12, a second link section 13 and a second extension section 14 by dividing an outer side of the plastic film. The first back adhesive 3 is placed in advance on an inner side of the heat conductive plate 1 and across the cover section10, the first link section 11 and the first extension section 12. The plastic film can be formed by a polyethylene terephthalate (PET, mylar) film, the metal sheet can be formed by a copper sheet, and the heat conductive plate 1 thus has an outstanding heat conductivity.

Figure 5:
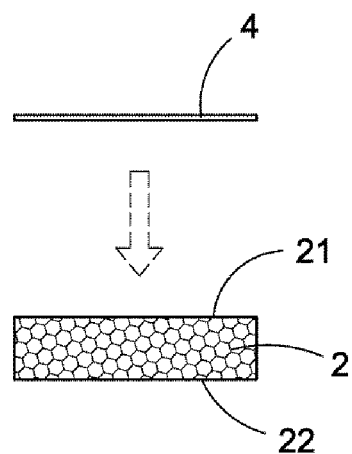
FIG. 5 is a section schematic diagram of a second back adhesive to be placed in advance on an adhering surface.

Secondly, as shown by step b in FIG. 1 and FIG. 5, a buffer member 2 and a second back adhesive 4 are prepared. The buffer member 2 has an adhering surface 21 and an abutting surface 22 opposite to each other. The second back adhesive 4 is placed in advance at the adhering surface 21. The buffer member 2 can be formed by a thermal pad or sponge.

Figure 6:
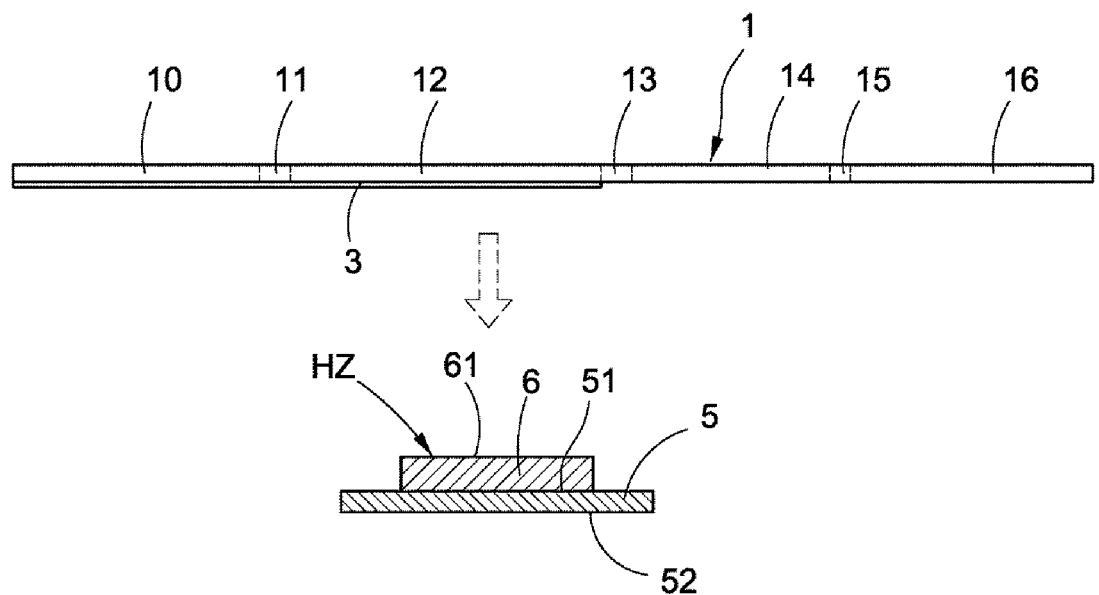
FIG. 6 is a section schematic diagram of a cover section to be adhered to a heat zone and a first extension section to be adhered to a second installation surface.
Figure 7:
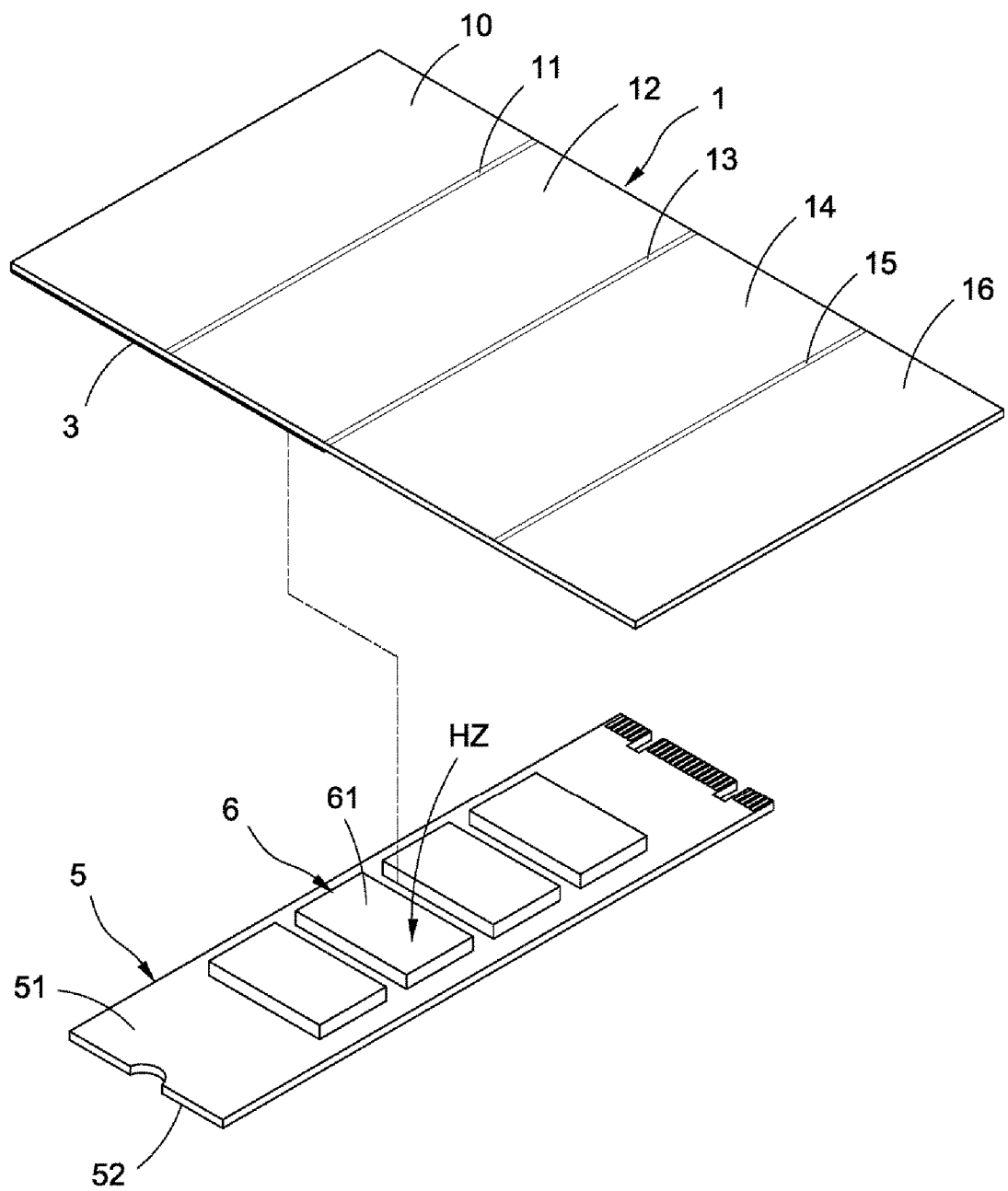
FIG. 7 is a perspective schematic diagram of a cover section to be adhered to a heat zone and a first extension section to be adhered to a second installation surface.

Thirdly, as shown by step c in FIG. 1, FIG. 6 and FIG. 7, a sub circuit board 5 is prepared. The sub circuit board 5 has a first installation surface 51 and a second installation surface 52 opposite to each other, wherein the first installation surface 51 are installed with a plurality of chips 6, and top surfaces 61 of the plurality of chips 6 form a heat zone HZ. The sub circuit board 5 and the plurality of chips 6 can form, for example but not limited to, a solid-state drive (SSD).

Figure 8:
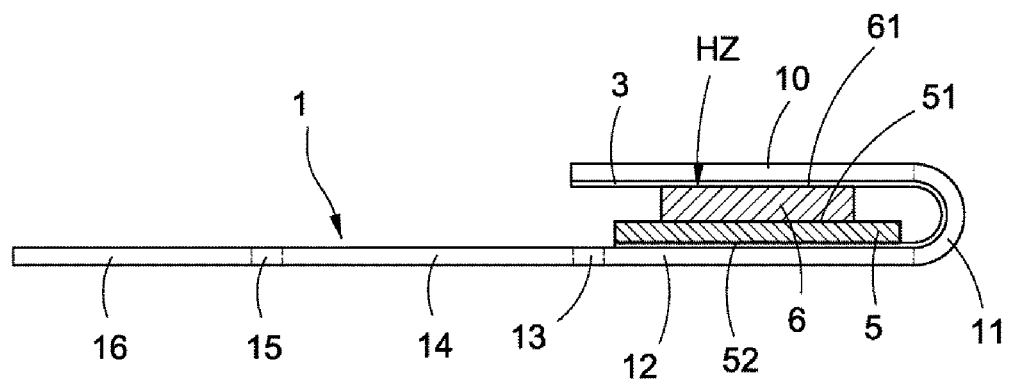
FIG. 8 is a section schematic diagram of a cover section having been adhered to a heat zone, and a first extension section adhered to a second installation surface.

Fourthly, as shown by step d in FIG. 1 and FIG. 8, release paper of the first back adhesive 3 is removed, so as to adhere the cover section 10 to the heat zone HZ and to adhere the first extension section 12 to the second installation surface 52.

Figure 9:
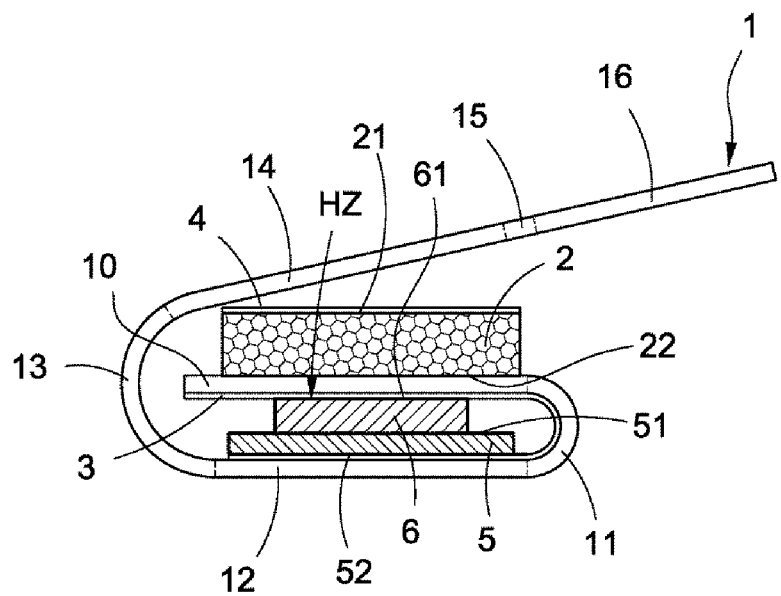
FIG. 9 is a section schematic diagram of an adhering surface of a buffer member to be adhered to an inner side of a second extension section.
Figure 10:
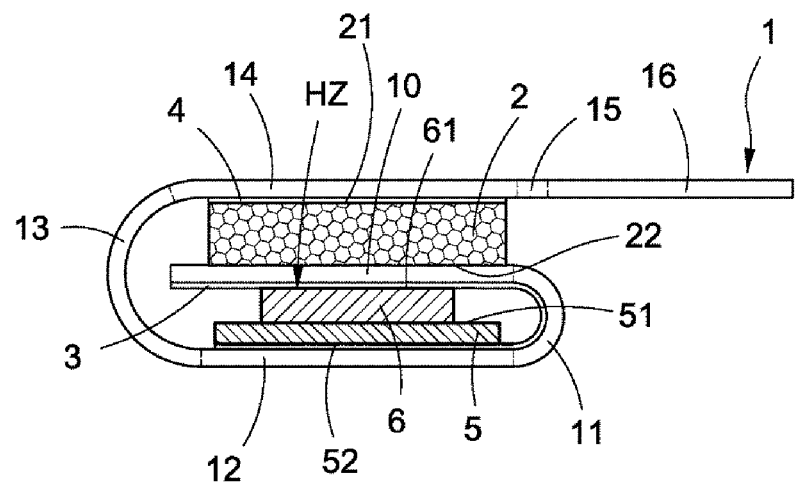
FIG. 10 is a section schematic diagram of a heat dissipation module of the present invention.

Fifthly, as shown by step e in FIG. 1, FIG. 9 and FIG. 10, release paper of the second back adhesive 4 is removed, the adhering surface 21 of the buffer member 2 is adhered to an inner side of the second extension section 14, and the abutting surface 22 is abutted against an outer side of the cover section 10.

Figure 11:
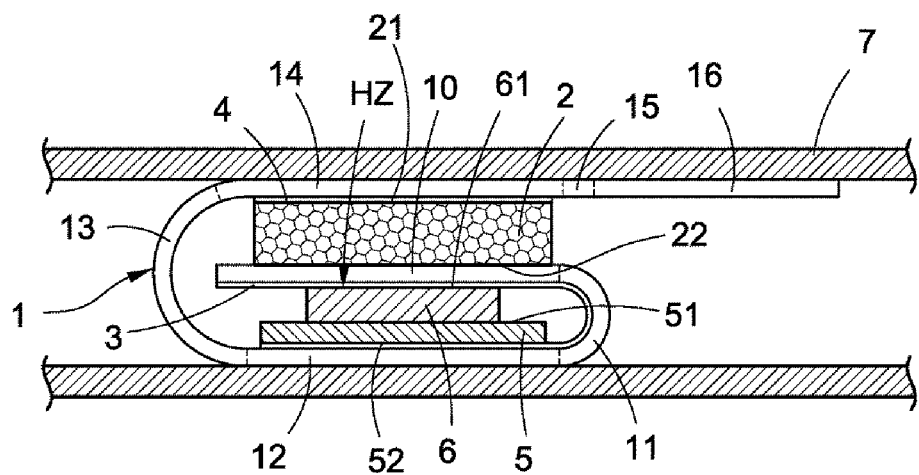
FIG. 11 is a schematic diagram of a state of use of a heat dissipation module of the present invention.

As shown by step f in FIG. 1 and FIG. 11, an electronic device is provided, and the sub circuit board 5 is fixed at an interior of the electronic device. The electronic device includes a housing 7, and interfering matching is formed between the heat conductive plate 1 and the housing 7 through the buffer member 2. Thus, the assembly of the heat dissipation module of the present invention is complete.

FIG. 10 and FIG. 11 show a state of use of a heat dissipation module of the present invention. The heat conductive plate 1 includes the cover section 10 and the first extension section, and the cover section 10 covers the heat zone HZ; the buffer member 2 is provided at the heat conductive plate 1 so as to interferingly match with the housing 7, thereby transmitting heat energy produced by the heat zone HZ to the housing 7.

Details are further given below. The sub circuit board 5 has a first installation surface 51 and a second installation surface 52 opposite to each other. The top surfaces 61 of the plurality of chips 6 installed on the first installation surface 51 form the heat zone HZ, the cover section 10 is adhered to the heat zone HZ by using the first back adhesive 3 provided on the inner side of the heat conductive plate 1, and the cover section 10 has a size enough for covering the entire heat zone HZ; that is, the size of the cover section 10 is greater than or equal to the heat zone HZ and completely covers the heat zone HZ. Further, the first extension section 12 is adhered to the second installation surface 52 of the sub circuit board 5 by using the first back adhesive 3 provided on the inner side of the heat conductive plate 1; that is, the heat conductive plate 1 envelops the sub circuit board 5 by using the cover section 10 and the first extension section 12.

Further, the sub circuit board 5 is installed to a motherboard (not shown) by first using a plate-to-plate connector, the buffer member 2 has the adhering surface 21 and the abutting surface 22 opposite to each other, the adhering surface 21 is adhered to the inner side of the second extension section 14 by using the second back adhesive 4, and the abutting surface 22 is abutted against the outer side of the cover section 10.

Then, when the sub circuit board 5 is fixed to at an interior of the housing 7 of the electronic device, the buffer member 2 is clamped between the sub circuit board 5 and the housing 7 and is thus pressed and deformed. The deformed buffer member 2 produces an elastic restoring force, and accordingly provides a forward force for pushing the heat conductive plate 1 towards the housing 7, in a way that the heat conductive plate 1 is reliably thermally adhered to the housing 7 through the buffer member 2, thereby increasing the contact area for thermal conduction and achieving enhanced heat dissipation efficiency for the heat dissipation module.

Moreover, the heat conductive plate 1 further includes a third link section 15 and a third extension section 16. The first link section 11 is provided between the cover section 10 and the first extension section, the second link section 13 is provided between the first extension section 12 and the second extension section 14, and the third link section 15 is provided between the second extension section 14 and the third extension section.

The third link section 15 and the third extension section 16 are for thermally adhering to the housing 7; that is, the second extension section 14, the third link section 15 and the third extension section 16 are jointly thermally adhered to the housing 7. The heat energy produced by the heat zone HZ is sequentially thermally conducted from the cover section 10, the buffer member 2, the second extension section 14, the third link section 15 and the third extension section 16 to the housing 7 for heat dissipation. Compared to that of only the second extension section 14 is thermally adhered to the housing 7, the contact area for thermal conduction is reliably increased so as to enhance the heat dissipation efficiency for the heat dissipation module.

Figure 12:
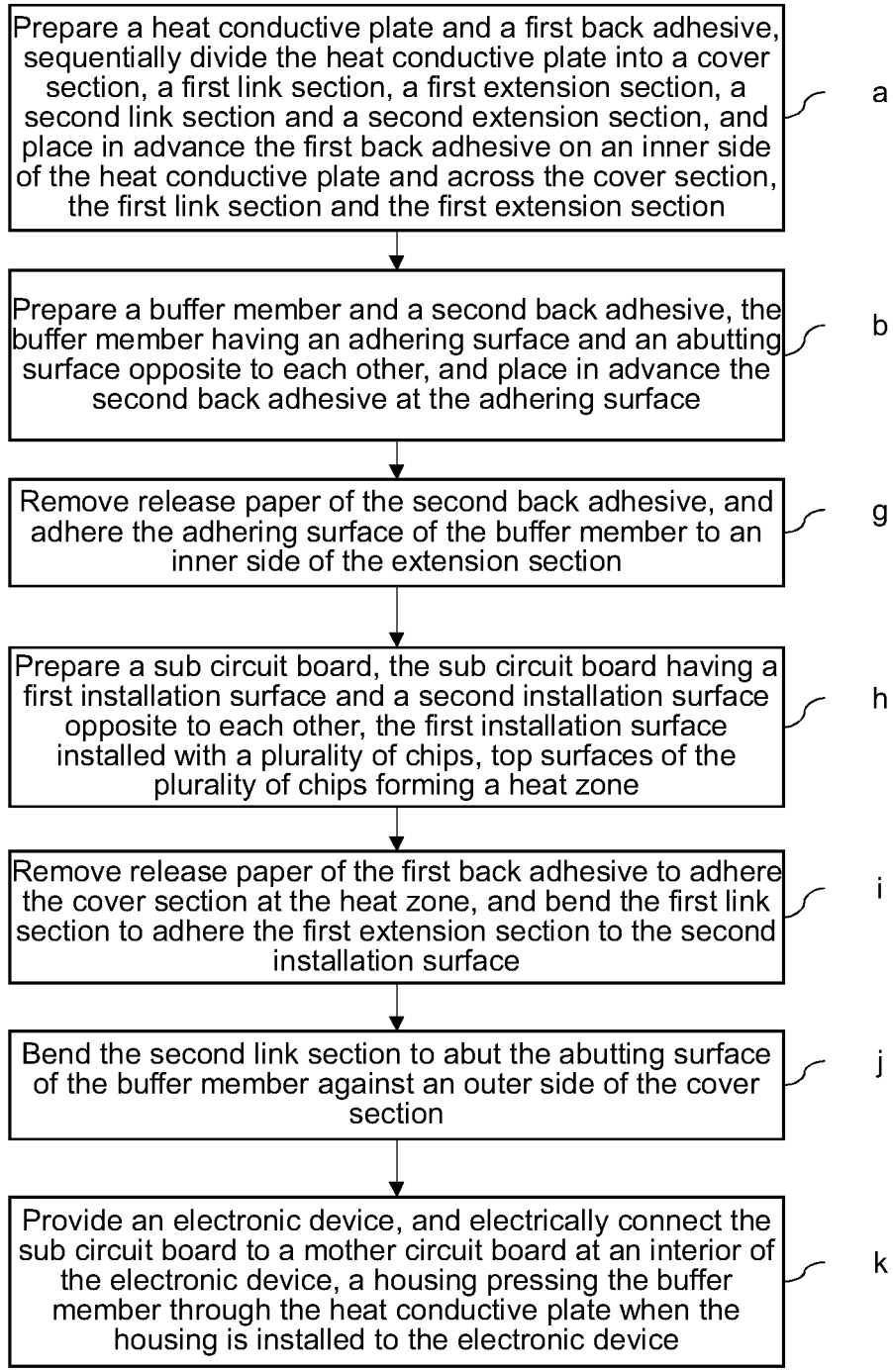
FIG. 12 is another flowchart of steps of an assembly method for a heat dissipation module of the present invention.

FIG. 12 shows another flowchart of steps of an assembly method for a heat dissipation module of the present invention. Steps after step b can also be adjusted as below.

Figure 13:
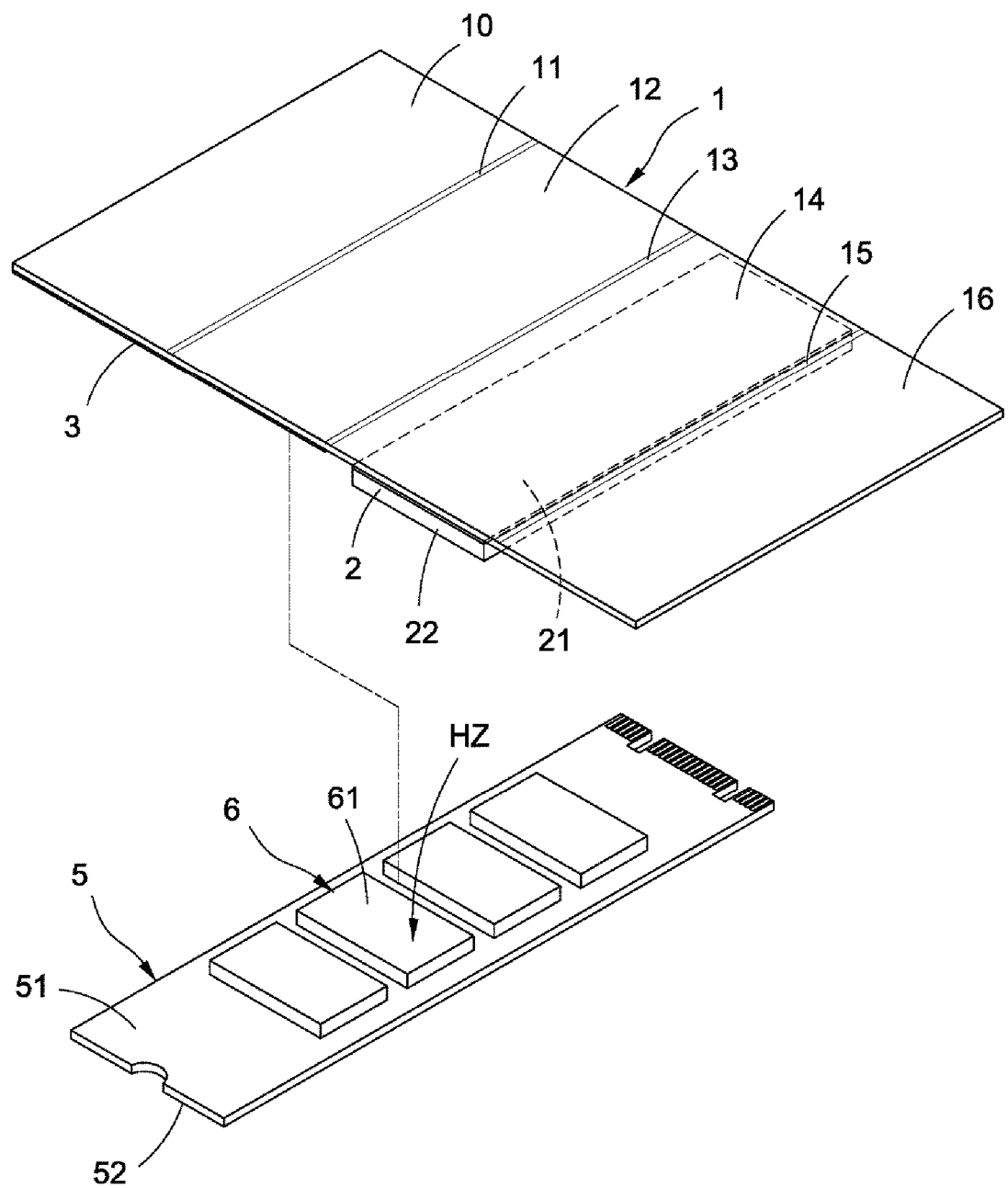
FIG. 13 is a perspective schematic diagram of an adhering surface of a buffer member having been adhered to an inner side of a second extension section.

First of all, as shown by step g in FIG. 12 and with reference to FIG. 5 and FIG. 13, the release paper of the second back adhesive 4 is removed, and the adhering surface 21 of the buffer member 2 is adhered to the inner side of the second extension section 14.

As shown by step h in FIG. 12 and with reference to FIG. 13, the sub circuit board 5 is prepared. The sub circuit board 5 has the first installation surface 51 and the second installation surface 52 opposite to each other, wherein the first installation surface 51 is installed with a plurality of chips 6, and the top surfaces 61 of the plurality of chips 6 form the heat zone HZ.

Figure 14:
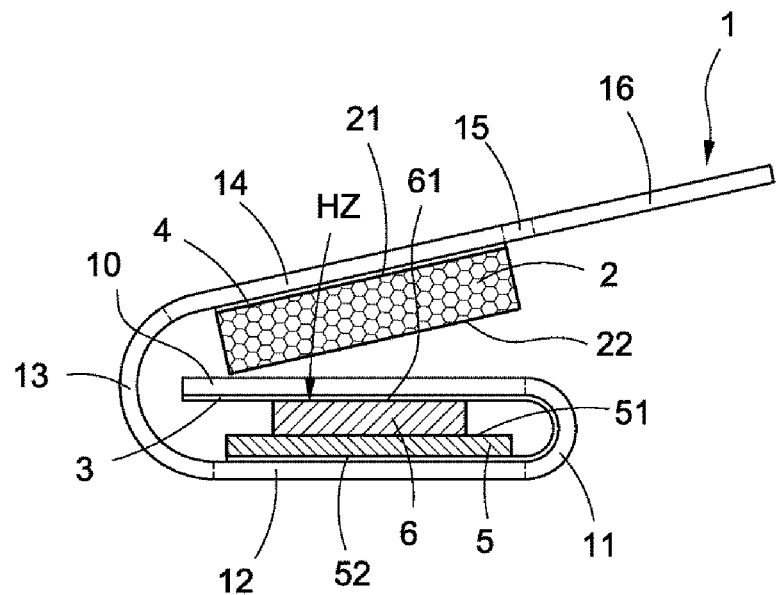
FIG. 14 is a section schematic diagram of an adhering surface of a buffer member having been adhered to an inner side of a second extension section.

Next, as shown by step i in FIG. 12 and with reference to FIG. 14, the release paper of the first back adhesive 3 is removed to adhere the cover section 10 to the heat zone HZ, and the first link section 11 is bent to adhere the first extension section 12 to the second installation surface 52.

Then, as shown by step j in FIG. 12 and with reference to FIG. 10, the second link section 13 is bent to abut the abutting surface 22 of the buffer member 2 against the outer side of the cover section 10.

Finally, as shown by step k in FIG. 12 and with reference to FIG. 11, an electronic device is provided, and the sub circuit board 5 is electrically connected to a mother circuit board (not shown) at the interior of the electronic device. When the housing 7 is installed to the electronic device, the housing 7 presses the buffer member 2 through the heat conductive plate 1. A connection port (referring to FIG. 13) at an end of the sub circuit board is for electrically connecting to the mother circuit board (not shown). Thus, the assembly of the heat dissipation module of the present invention is complete.

Figure 15:
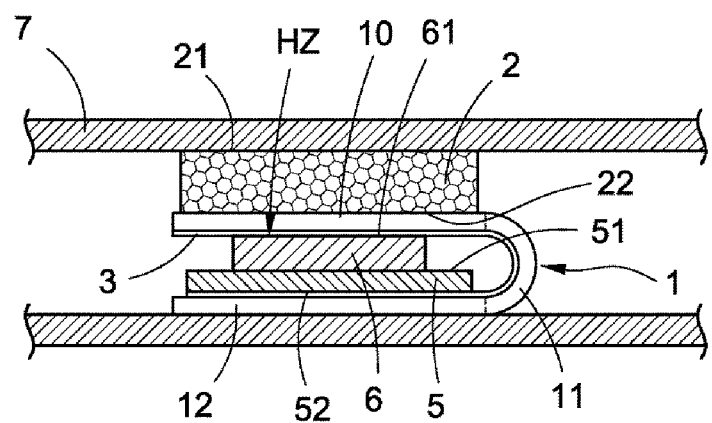
FIG. 15 is a section schematic diagram of a heat dissipation module according to another embodiment of the present invention.

FIG. 15 shows a heat dissipation module according to another embodiment of the present invention. The embodiment in FIG. 15 is substantially the same as the embodiments in FIG. 2 to FIG. 13; the embodiment in FIG. 15 differs from the embodiments in FIG. 2 to FIG. 13 in that, the heat conductive plate 1 includes only the cover section 10, the first link section 11, and the first extension section 12, but does not include the second link section 13, the second extension section 14, the third link section 15 and the third extension section (referring to FIG. 11).

Details are further given below. If the contact area of the housing 7 is limited, the increased area of the heat conductive plate 1 is still incapable of coming in contact with the housing 7. Thus, the structure of the heat conductive plate 1 can be simplified, such that the heat conductive plate 1 includes only the cover section 10, the first link section 11 and the first extension section 12. The cover section 10 is adhered to the heat zone HZ by using the first back adhesive 3 provided on the inner side of the heat conductive plate 1, the first extension section 12 is adhered to the second installation surface 52 of the sub circuit board by using the first back adhesive 3 provided on the inner side of the heat conductive plate 1, and the adhering surface 21 of the buffer member 2 is then directly thermally adhered to the housing 7, with the abutting surface 22 directly abutted against the outer side of the cover section 10. Thus, the buffer member 2 is clamped between the sub circuit board 5 and the housing 7, and becomes pressed and deformed. The deformed buffer member 2 produces an elastic restoring force, so as to provide a forward force for directly thermally adhering to the housing 7, further sequentially thermally conducting the heat energy of the heat zone HZ from the cover section 10 and the buffer member 2 to the housing 7 for heat dissipation.

Further, the buffer member 2 can be formed by a thermal pad or sponge, wherein the thermal conductivity of the thermal pad is larger than the thermal conductivity of the sponge. Therefore, the buffer member 2 of the embodiment is preferably implemented by a thermal pad.

Figure 16:
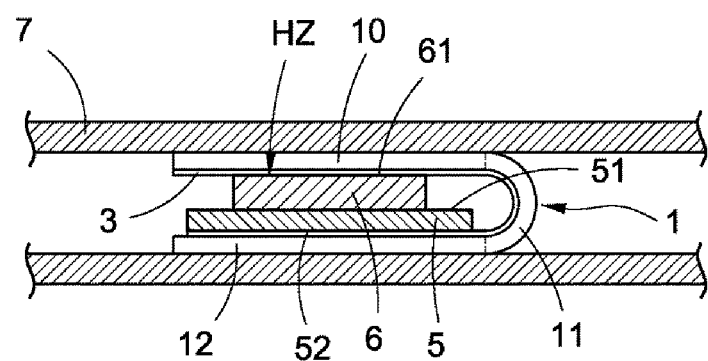
FIG. 16 is a section schematic diagram of a heat dissipation module according to yet another embodiment of the present invention.

FIG. 16 shows a heat dissipation module according to yet another embodiment of the present invention. The embodiment in FIG. 16 is substantially the same as the embodiment in FIG. 15; the embodiment in FIG. 16 differs from the embodiment in FIG. 15 in that, the heat dissipation module does not include the buffer member 2 (referring to FIG. 15). Alternatively, the buffer member 2 can be omitted according to actual heat dissipation requirements.

In conclusion, the heat dissipation module and the assembly method thereof of the present invention neither are disclosed in similar products and nor have been publicly used, and are industrially applicable and novel and involve an inventive step, which meet the requirements of a patent application. Therefore, a patent application is filed accordingly, and granting the application with patent rights is respectfully requested to ensure rights of the Inventor.

What is claimed is:

1. A heat dissipation module, comprising:
   a sub circuit board (5), having a first installation surface (51) and a second installation surface (52) opposite to each other;
   a heat conductive plate (1), comprising a cover section (10) and a first extension section (12), the cover section (10) covering a heat zone (HZ); and
   a buffer member (2), provided at the heat conductive plate (1) to interferingly match with a housing (7) so as to conduct heat energy produced by the heat zone (HZ) to the housing (7),
   wherein the first extension section (12) is adhered to the second installation surface (52) of the sub circuit board (5) by using a first back adhesive (3) provided on an inner side of the heat conductive plate (1).

2. The heat dissipation module according to claim 1, wherein the heat conductive plate (1) further comprises a first link section (11), a second link section (13), a second extension section (14), a third link section (15) and a third extension section (16), the first link section (11) provided between the cover section (10) and the first extension section (12), the second link section (13) provided between the first extension section (12) and the second extension section (14), the third link section (15) provided between the second extension section (14) and the third extension section (16).

3. The heat dissipation module according to claim 1, wherein the cover section (10) is adhered to the heat zone (HZ) by using the first back adhesive (3) provided on the inner side of the heat conductive plate (1).

4. The heat dissipation module according to claim 1, wherein the heat conductive plate (1) is formed by a metal sheet enveloped by a plastic film.

5. The heat dissipation module according to claim 1, wherein the first installation surface (51) is installed with a plurality of chips (6), top surfaces (61) of the plurality of chips (6) form the heat zone (HZ), and a size of the cover section (10) is capable for completely covering the heat zone (HZ).

6. A heat dissipation module, comprising:
   a sub circuit board (5), having a first installation surface (51) and a second installation surface (52) opposite to each other, wherein the first installation surface (51) is installed with a plurality of chips (6), top surfaces (61) of the plurality of chips (6) form a heat zone (HZ); and
   a heat conductive plate (1), comprising a cover section (10) and a first extension section (12), the cover section (10) covering the first installation surface (51), the first extension section (12) covering the second installation surface (52), wherein the cover section (10) is capable of completely covering the heat zone (HZ), and the first extension section (12) conducts heat energy produced by the heat zone (HZ) to below the second installation surface (52).

7. The heat dissipation module according to claim 6, further comprising:
   a buffer member (2), provided at the heat conductive plate (1) to interferingly match with a housing (7), the heat conductive plate (1) conducting the heat energy produced by the heat zone (HZ) through the buffer member (2) to the housing (7).

8. A heat dissipation module, comprising:
a sub circuit board (5), having a first installation surface (51) and a second installation surface (52) opposite to each other; and
a heat conductive plate (1), comprising a cover section (10) and a first extension section (12), the cover section (10) covering the first installation surface (51), the first extension section (12) covering the second installation surface (52),
wherein the first extension section (12) is adhered to the second installation surface (52) of the sub circuit board (5) by using a first back adhesive (3) provided on an inner side of the heat conductive plate (1).

9. The heat dissipation module according to claim 8, wherein the first installation surface (51) is installed with a plurality of chips (6), top surfaces (61) of the plurality of chips (6) form a heat zone (HZ), the cover section (10) is capable of completely covering the heat zone (HZ), and the first extension section (12) conducts heat energy produced by the heat zone (HZ) to below the second installation surface (52).

10. The heat dissipation module according to claim 9, wherein the cover section (10) is adhered to the heat zone (HZ) by using the first back adhesive (3) provided on the inner side of the heat conductive plate (1).

11. The heat dissipation module according to claim 8, further comprising:
a buffer member (2), provided at the heat conductive plate (1) to interferingly match with a housing (7), the heat conductive plate (1) conducting the heat energy produced by the heat zone (HZ) through the buffer member (2) to the housing (7).

12. The heat dissipation module according to claim 8, wherein the heat conductive plate (1) further comprises a first link section (11), a second link section (13), a second extension section (14), a third link section (15) and a third extension section (16), the first link section (11) provided between the cover section (10) and the first extension section (12), the second link section (13) provided between the first extension section (12) and the second extension section (14), the third link section (15) provided between the second extension section (14) and the third extension section (16).

13. The heat dissipation module according to claim 6, wherein the heat conductive plate (1) further comprises a first link section (11), a second link section (13), a second extension section (14), a third link section (15) and a third extension section (16), the first link section (11) provided between the cover section (10) and the first extension section (12), the second link section (13) provided between the first extension section (12) and the second extension section (14), the third link section (15) provided between the second extension section (14) and the third extension section (16).

* * * * *